US007795112B2

(12) United States Patent
Ponomarev et al.

(10) Patent No.: US 7,795,112 B2
(45) Date of Patent: Sep. 14, 2010

(54) METHOD OF FABRICATING SELF-ALIGNED SOURCE AND DRAIN CONTACTS IN A DOUBLE GATE FET WITH CONTROLLED MANUFACTURING OF A THIN SI OR NON-SI CHANNEL

(75) Inventors: Youri V. Ponomarev, Leuven (BE); Josine Johanna Gerarda Petra Loo, Leuven (BE)

(73) Assignees: IMEC, Leuven (BE); NXP B.V., Eindhoven (NL)

( * ) Notice: Subject to any disclaimer, the term of this patent is extended or adjusted under 35 U.S.C. 154(b) by 1010 days.

(21) Appl. No.: 11/093,265

(22) Filed: Mar. 28, 2005

(65) Prior Publication Data

US 2005/0227444 A1 Oct. 13, 2005

(30) Foreign Application Priority Data

Mar. 29, 2004 (EP) .................................. 04101291

(51) Int. Cl.
*H01L 21/30* (2006.01)
(52) U.S. Cl. ............... 438/458; 257/347; 257/E21.568; 257/E29.295
(58) Field of Classification Search ............ 257/9, 257/347, 349, 500, 401, E21.421, E29.264, 257/E21.568, E21.569, E29.295; 438/162, 438/286, 289, 459, 689, 285, 192, 165, 302, 438/370, 377, 310, 517, 977, 458; 451/285
See application file for complete search history.

(56) References Cited

U.S. PATENT DOCUMENTS 4,980,308 A * 12/1990 Hayashi et al. ............. 438/157

5,964,652 A * 10/1999 Melzner et al. ............. 451/285
6,214,693 B1 4/2001 Komatsu (Continued)

FOREIGN PATENT DOCUMENTS

JP 2003 309267 A 10/2003

(Continued)

OTHER PUBLICATIONS

European Search Report dated May 15, 2008, for European Application No. 05003842.1.

*Primary Examiner*—W. David Coleman
*Assistant Examiner*—Latanya Crawford
(74) *Attorney, Agent, or Firm*—Knobbe Martens Olson & Bear LLP

(57) ABSTRACT

A method of forming a transistor structure on a substrate (SOI) is disclosed, wherein the substrate comprises a supporting Si layer, a buried insulating layer, and a top Si layer. The method comprises forming a gate region of the transistor structure on the top Si layer, wherein the gate region is separated from the top Si layer by a dielectric layer, and wherein the top Si layer comprises a high dopant level. The method further comprises forming an open area on the top Si layer demarcated by a demarcating oxide and/or resist layer region, forming high level impurity or heavily-damaged regions by ion implantation, and exposing the open area to an ion beam, wherein the ion beam comprises a combination of beam energy and dose, and wherein the demarcating layer region and the gate region act as an implantation mask.

22 Claims, 2 Drawing Sheets

U.S. PATENT DOCUMENTS

| | | | |
|---|---|---|---|
| 6,335,214 B1* | 1/2002 | Fung | 438/30 |
| 6,359,312 B1* | 3/2002 | Komatsu | 257/354 |
| 6,458,662 B1* | 10/2002 | Yu | 438/286 |
| 6,509,613 B1* | 1/2003 | En et al. | 257/349 |
| 6,528,375 B2* | 3/2003 | Gregory | 438/302 |
| 6,610,576 B2* | 8/2003 | Nowak | 438/301 |
| 6,621,124 B2* | 9/2003 | Ponomarev | 257/347 |
| 6,686,630 B2* | 2/2004 | Hanafi et al. | 257/366 |
| 6,753,239 B1* | 6/2004 | Conn | 438/459 |
| 6,833,569 B2* | 12/2004 | Dokumaci et al. | 257/250 |
| 6,844,225 B2* | 1/2005 | Chen et al. | 438/165 |
| 6,908,820 B2* | 6/2005 | Koyama | 438/279 |
| 6,930,007 B2* | 8/2005 | Bu et al. | 438/289 |
| 7,122,863 B1* | 10/2006 | Ju et al. | 257/349 |
| 7,182,914 B2* | 2/2007 | Lai et al. | 422/82.01 |
| 2001/0017388 A1* | 8/2001 | Ponomarev | 257/347 |
| 2002/0185655 A1* | 12/2002 | Fahimulla et al. | 257/192 |
| 2002/0190322 A1* | 12/2002 | Mouli | 257/347 |
| 2003/0025157 A1* | 2/2003 | Ho et al. | 257/347 |
| 2003/0027381 A1* | 2/2003 | Buynoski et al. | 438/162 |
| 2003/0089899 A1* | 5/2003 | Lieber et al. | 257/9 |
| 2003/0141566 A1* | 7/2003 | Desko et al. | 257/500 |
| 2003/0228724 A1* | 12/2003 | Koyama | 438/174 |
| 2004/0113234 A1* | 6/2004 | Abadeer et al. | 257/530 |
| 2004/0169227 A1* | 9/2004 | Wei et al. | 257/347 |
| 2004/0222471 A1* | 11/2004 | Inoh | 257/365 |
| 2005/0023656 A1* | 2/2005 | Leedy | 257/678 |
| 2005/0054164 A1* | 3/2005 | Xiang | 438/285 |
| 2005/0205931 A1* | 9/2005 | Mouli | 257/347 |
| 2006/0068530 A1* | 3/2006 | Schnitt et al. | 438/149 |
| 2006/0148256 A1* | 7/2006 | Vinet et al. | 438/689 |

FOREIGN PATENT DOCUMENTS

WO    WO 03/093934 A1    10/2003

* cited by examiner

METHOD OF FABRICATING SELF-ALIGNED SOURCE AND DRAIN CONTACTS IN A DOUBLE GATE FET WITH CONTROLLED MANUFACTURING OF A THIN SI OR NON-SI CHANNEL

BACKGROUND OF THE INVENTION

1. Field of the Invention

The present invention relates to a method of fabricating source and drain contacts and a channel region.

Also, the present invention relates to a FET comprising such source and drain contacts and such a channel region. Furthermore, the present invention relates to a semiconductor device comprising such a FET.

2. Description of the Related Art

U.S. Pat. No. 6,458,662 B1 discloses a method of fabricating a dual gate MOSFET. The method defines an asymmetrical dual gate structure which flanks a fin structure and is disposed approximately 90° from the source/drain structure in the Si layer. The fin structure comprises an epitaxial SiGe/Si/SiGe sandwich which acts as a channel region.

After the formation of the fin structure and the gate electrodes, the source and drain regions are formed in a completing step.

Such a Double-Gate structure from the prior art has certain disadvantages.

Due to its layout the double gate structure has a current path which substantially resides in the sidewalls of the fin. This type of current path may result in a deterioration of the performance of the device unless extreme care is taken to ensure that a substantially perfect interface exists between the Si region, the side-walls and the dielectric region(s).

Also, depending on the orientation of the fin on the wafer, the current path lies in different crystallographic planes of Si, resulting in a different current drivability.

Moreover, the formation of the source/drain junctions may be complicated by the fact that high-angle implantations of dopants have to be used to reach the whole volume of the respective fin parts.

Furthermore, the height of the fin sets the absolute value of the current drive of the device (here the height acts similarly as a "width" dimension of a conventional MOSFET). Typically, in modern circuits the aspect ratio of the gate length to the width is as large as 10 (or even 20 for P-type devices), which means that for a gate length of 50 nm, the height of the fin would have to be about 500 nm.

At the same time the fin width (Si channel thickness between the gates) has to be smaller than ⅓ of the gate length, which for a 50 nm gate device of this example would imply a fin width of 16.5 nm. As is known to persons skilled in the art, the formation of the fin having a width of about 16 nm and a height of about 500 nm is not possible with current manufacturing capabilities (an aspect ratio between fin width and device height up to 5-6 seems reasonable, but a ratio of about 30 as described above in this example is not). A solution for this problem is believed to be the use of multiple fins for a device, however, this requires some significant issues to be resolved: all fins have to be exactly the same, and they cannot be spaced densely since the formation of source/drain junctions as mentioned above requires sufficient distance to allow high-angle implantations to be performed.

In summary, the combination of all the factors mentioned above results in a very important limitation of the prior art. This limitation necessitates that most of the current circuit designs must be re-done completely. Ideally, one would want to have a multi-gate device which, at least from the point of view of a circuit designer, is exactly the same as a standard planar single gate device.

This implies that a planar device, with the Si channel sandwiched in between two gates, would be much more suitable. However, in fabricating such a double-gate device, there are two major issues that have to be overcome:

alignment of the two gates to each other (if not, parasitic capacitances will have a serious effect on the speed of operation of the device), source/drain contacts are required to have the lowest possible resistance (otherwise the current drive will be significantly reduced) and a very steep/sharp interface to the channel (otherwise the short-channel effects will be pronounced).

SUMMARY OF CERTAIN INVENTIVE ASPECTS

It is an object of inventive aspects to provide a method of fabricating source and drain contacts and a channel region which cancels out the limitations of the prior art.

The object is achieved in various aspects by a method of forming a transistor structure on a substrate, the substrate comprising a supporting Si layer, a buried insulating layer, and a top Si layer comprising a high dopant level, the transistor structure comprising a gate region, and a source and drain region; the method comprising:

the formation of the gate region on the top Si layer, the gate region being separated from the top Si layer by a dielectric layer;

the formation of an open area on the top Si layer, demarcated by a demarcating oxide and/or resist layer region;

the formation of high level impurity or heavily-damaged regions by ion implantation, exposing the open area to an ion beam with the demarcating layer region and the gate region acting as implantation mask, wherein the ion beam comprises a combination of beam energy and dose, which allows the formation, in the top Si layer, of high impurity level regions below the source and drain regions in the buried insulating layer and of a high impurity level or heavily-damaged region below the gate region in the top Si layer.

Advantageously, the method according to the present invention achieves the above-described goal of manufacturing a FET device as suggested above. From the perspective of circuit design there will be no need to change any design layouts.

Moreover, the present invention relates to a (MOS)FET fabricated in accordance with the method as described above.

Also other transistor structures such as bipolar devices may be fabricated in accordance with the method as described above.

Furthermore, the present invention relates to a semiconductor device comprising a FET transistor structure such as a MOSFET or bipolar device fabricated by the method as described above.

BRIEF DESCRIPTION OF THE DRAWINGS

Below, the invention will be explained with reference to some drawings, which are intended for illustration purposes only and not to limit the scope of protection as defined in the accompanying claims.

DETAILED DESCRIPTION OF CERTAIN INVENTIVE EMBODIMENTS

Figure 1:
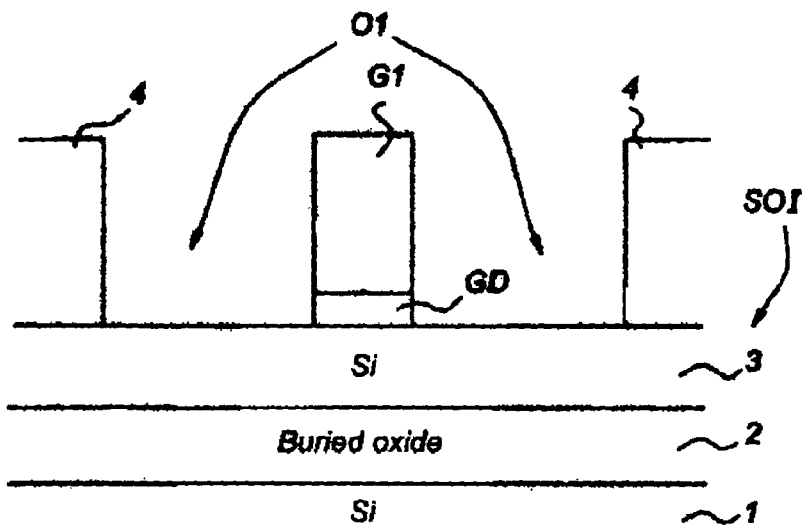
FIG. 1 shows schematically a gate structure for a MOSFET according to an embodiment of the present invention.

FIG. 1 shows schematically a gate structure for a MOSFET according to an embodiment of the present invention.

The MOSFET structure is shown here as an illustration of a method for forming a transistor structure. Also a transistor structure like a bipolar device may be fabricated by this method. This will be explained in more detail below.

The MOSFET to be formed is defined on a silicon-on-insulator (SOI) substrate, which comprises a supporting Si layer 1, a buried silicon dioxide layer 2, and a top Si layer 3. The top Si layer 3 is a doped layer, the dopant level being such as to enable the formation of good source/drain regions, e.g. $1 \times 10^{20} - 1 \times 10^{21}$ cm$^{-3}$. The gate of the MOSFET is to be formed on top of Si layer 3 of the SOI substrate.

In an initial processing stage a first gate structure G1 is defined above the top Si layer 3. The first gate G1 is electrically isolated from top Si layer 3 by a gate dielectric GD. The formation of the first gate G1 can be done by any suitable process known to a person skilled in the art.

An open area O1 of the top Si layer 3 is demarcated by an oxide layer or a resist layer 4, which is formed by any suitable process known to a skilled person.

The dimensions of the first gate G1 and the thickness of gate dielectric GD can be arbitrarily chosen in accordance with the application of the structure.

Figure 2:
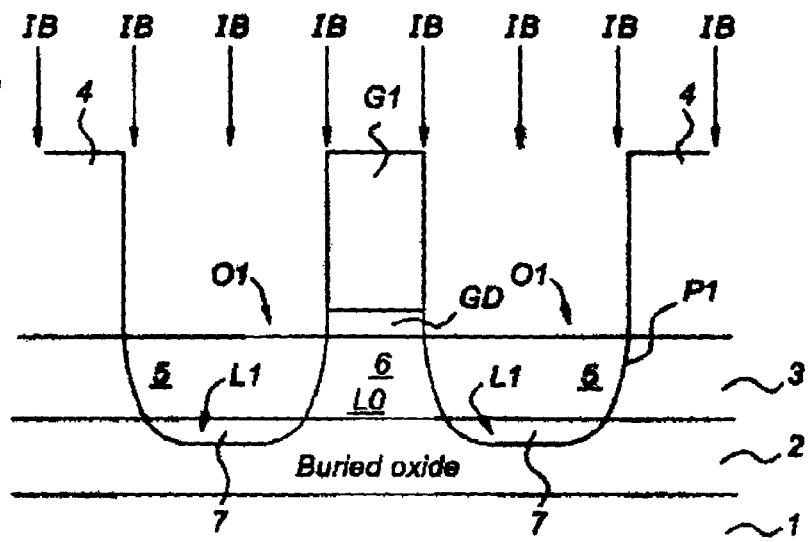
FIG. 2 shows schematically a first processing stage for forming self-aligned source and drain regions for a MOSFET according to an embodiment of the present invention.

FIG. 2 shows schematically a first processing stage for forming self-aligned source/drain regions for a MOSFET according to an embodiment of the present invention.

After definition of the gate structure G1, GD, and open regions 5, a "through the gate" ion implantation, denoted by arrows IB, is performed. The impurity species is chosen on the basis of its ability to allow (in a subsequent step) a selective removal of the implanted regions relative to the non-implanted regions. During this process, the gate G1 and the oxide or resist layer 4 act as implantation mask for the impurity species.

According to embodiments of the present invention, the beam energy and dose of the ion beam IB provides for the formation of an impurity species concentration profile P1 with a high impurity level L0 in a region 6 of the top Si layer 3 below the gate structure G1, GD (and below the oxide or resist layer 4), and with a high impurity level L1 in the Buried Oxide layer regions 7 below the open regions 5. In the open regions 5 the impurity level is relatively low. The implantation with a high impurity level L0 can also cause heavy damage of the Si lattice in the region 6 of the top Si layer and even make it amorphous.

The high impurity level L0 in the region 6 below the gate dielectric GD and the high impurity level L1 below the open regions 5 may be up to the maximum solubility of the dopant species in Si.

The ion beam IB may comprise Ar, N, Ge, I, or Br as dopant species. Persons skilled in the art will appreciate which settings of beam energy and dose of the ion beam are required to generate the desired impurity concentration profile P1 with a high impurity level L1 in the buried oxide layer below open regions 5, and a high impurity level L0 in the region 6 below the gate structure G1, GD.

If needed for the selectivity of the (later) removal process, an annealing step may be done at this stage.

Figure 3:
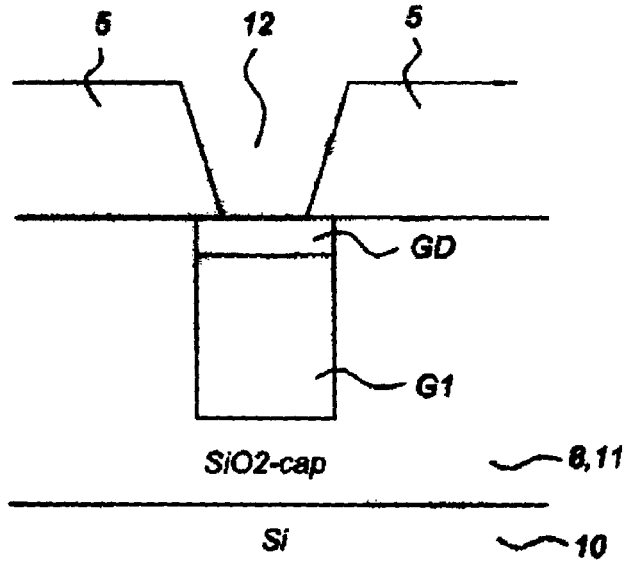
FIG. 3 shows schematically a second processing stage for forming self-aligned source and drain regions for a MOSFET according to an embodiment of the present invention.

FIG. 3 shows schematically a second processing stage for forming self-aligned source/drain regions for a MOSFET according to an embodiment of the present invention.

Firstly, the structure of open regions 5 and gate regions G1 is covered by a capping silicon-dioxide layer (SiO$_2$ cap) 8. The silicon-dioxide layer 8 is deposited by a suitable deposition process which does not adversely affect the created open regions 5 and gate regions G1, GD.

Next, a second substrate 10, comprising a top silicon-dioxide layer (SiO$_2$) 11, is bonded to the initial substrate SOI by a wafer bonding process known in the art. The top silicon-dioxide layer 11 of the second substrate 10 is arranged face-to-face on the surface of capping silicon-dioxide layer 8 of the substrate SOI.

In a further processing stage, the supporting silicon layer 1 and the buried silicon dioxide layer 2 of the substrate SOI are removed by a processing sequence of etching the supporting Si layer 1 and etching the buried silicon dioxide layer 2. The buried silicon dioxide layer 2 serves as a stop layer for the etching of the supporting silicon layer 1. The top Si layer 3 serves as a stop layer for the etching of the buried silicon dioxide layer 2. After this processing sequence, the top Si layer 3 is now the top layer of the second substrate 10. In this stage of the process according to the present invention, during etching of the buried silicon dioxide layer 2, all regions comprising a high impurity level, implanted by through-the-gate implantation, are simultaneously removed (in a selective mode relative to the non-implanted or low-level impurity regions G1).

In the second processing stage according to the present invention, the low level impurity region 6 is now removed by a selective etching process for silicon, which etching process provides specific etching of the low impurity level 6 under the G1 region. A high selectivity of this removal process ensures a substantially perfect alignment with the G1 region.

After removal of the low level impurity region 6, a gap 12 is formed in the Si layer between the open regions 5. Since the open regions 5 comprise dopant from the beginning (as top Si layer 3), the open regions 5 can act as source/drain regions 5.

It is known in the art that etching of a silicon layer by a given etchant can be specific depending on the presence and level of a specific impurity in the silicon layer. In the case of a monocrystalline Si layer, the specific etchant may even provide anisotropic etching, if required. Also, in the case of heavily damaged or amorphised Si, the boundary with crystalline Si can be used to ensure the selectivity.

Other low impurity level regions (in the first processing stage masked by oxide and/or resist layers 4) may at this stage be masked by a further oxide or resist layer mask (not shown) applied earlier.

It is noted that the gate dielectric GD may act as etch stop as well. Alternatively, the gate G1 may act as etch stop, in which case the etching process for the low level impurity region 6 removes the gate dielectric GD as well.

Figure 4:
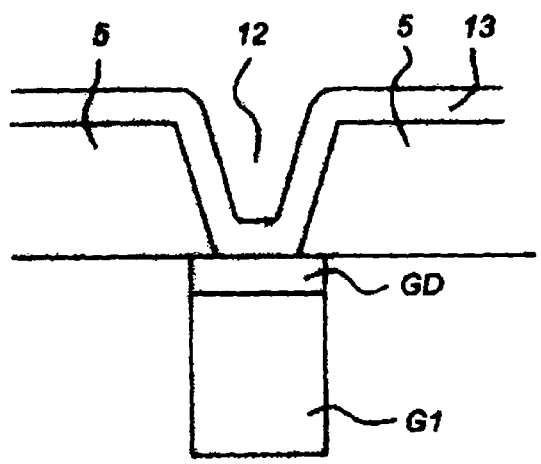
FIG. 4 shows schematically a third processing stage for forming a channel region for a MOSFET according to an embodiment of the present invention.

FIG. 4 shows schematically a third processing stage for forming a channel region for a MOSFET according to an embodiment of the present invention.

In a third processing stage, in the gap 12 between source/drain regions 5 a channel layer 13 is formed by a suitable deposition or growth process.

The channel material for the channel layer 13 can be chosen almost arbitrarily. The channel material may be Si, SiGe, GaAs, InP and another III-V or II-VI compound, an intermetallic compound like a metal-disilicide (e.g., $TiSi_2$, $CoSi_2$) or even a very thin layer of any metal that can be depleted by an electric field present in the device (exact thickness can be easily determined and depends on the density of states of a given material), a metal, e.g., Al, Cu, W, Ag, Au, Pt, Co, Ni.

Moreover, the channel material may comprise quantum-wire QW or quantum-dot QD structures.

Furthermore, the channel material may comprise nano-wires, arrays of nano-dots, carbon nano-dots, nano-tubes, organic or bio-organic molecules like DNA or proteins.

The choice of the channel material is limited only by the requirement that an electrical contact between the channel material 13 and the source/drain regions 5 can be obtained during deposition or growth of the channel material.

Figure 5A:
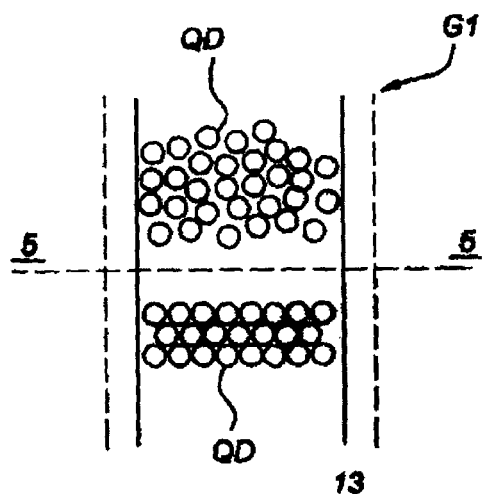
FIG. 5a shows schematically a plane view of the channel region in a first embodiment.
Figure 5B:
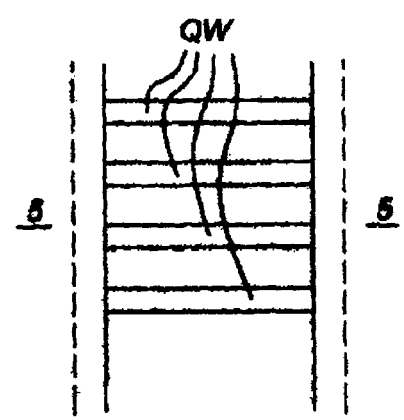
FIG. 5b shows schematically a plane view of the channel region in a second embodiment.
Figure 5C:
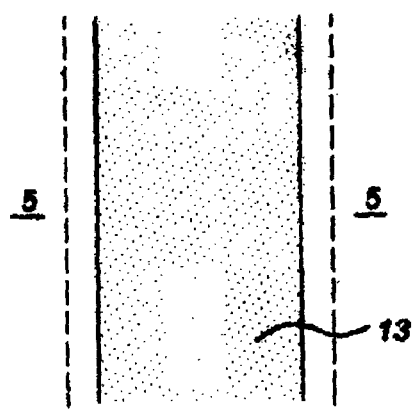
FIG. 5c shows schematically a plane view of the channel region in a third embodiment.

FIGS. 5a, 5b, 5c show schematically a plane view of the channel region in a first, a second and a third embodiment, respectively.

FIGS. 5a, 5b and 5c show a plane view of a channel region 13, below which the gate G1, depicted by dashed lines, is located (and also, if not removed by the etching process for silicon mentioned above, the gate dielectric GD, not shown here). On one side of the channel region 13, a source region 5 is located, and on the other side a drain region 5 is located.

In FIG. 5a a first embodiment is shown wherein a plurality of quantum-dots QD is arranged as the channel layer 13 between source and drain. The quantum-dots may be ordered as an array (lower part of FIG. 5a) or may be ordered in some random network (upper part of FIG. 5a).

In FIG. 5b a second embodiment is shown wherein a plurality of quantum-wires QW is arranged as channel layer 13 between source and drain regions 5. The quantum-wires QW are lengthwise arranged, with one end of the quantum-wire QW being in contact with the source region and the other end being in contact with the drain region.

In FIG. 5c a third embodiment is shown wherein the channel layer 13 is a continuous medium between source/drain regions.

The embodiments as shown in FIGS. 4, 5a, 5b, 5c, may be further processed by suitable, known IC processing techniques for passivation, metallization and contacting to obtain a microelectronic device comprising a MOSFET structure according to one of the embodiments as described above.

It is noted that the transistor structure as described above may differ from a MOSFET; the gate region G1 may comprise Si, but may also consist of a metal.

Further, the gate dielectric may be a gate oxide but may also be a high-k material such as $Si_3N_4$.

Also, on top of the channel material 13, a second gate stack (not shown) may be formed in a further deposition process. Subsequently, processing techniques for passivation, metallization and contacting may be applied for creating a microelectronic device with a double gate structure.

Moreover, the structure of source, drain and channel regions 5, 13 according to the present invention may also be embodied in a bipolar transistor, wherein the gate G1 is arranged as an emitter, the channel region 13 is arranged as a collector, the gate dielectric GD is arranged as a base and the source/drain regions 5 are arranged as contacts to the base. In that case, the materials for emitter, collector, and base must be chosen in accordance with the bipolar transistor function of the device.

Finally, it is noted that during formation of the gap 12, the etching process is arranged so as to obtain smooth and abrupt interfaces between the source/drain regions 5 and the gap 12. After the formation of the gap 12, the thermal budget of all successive processing steps is preferably kept to a minimum in order to keep the shape of the interfaces as abrupt as possible and to allow the formation of abrupt junctions between source/drain regions and the channel layer 13.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of forming a transistor structure on a substrate comprising a supporting Si layer, a buried insulating layer, and a top Si layer, the method comprising:
    forming a gate region of the transistor structure on the top Si layer, wherein the gate region is separated from the top Si layer by a dielectric layer, and wherein the top Si layer is doped;
    forming open areas on the top Si layer demarcated by at least one of a demarcating oxide, a resist layer region, and the gate region;
    exposing the transistor structure comprising the open areas to ion implantation through the gate region wherein the demarcating layer region and the gate region act as an implantation mask, so as to simultaneously form impurity regions below the open areas in the buried insulating layer and an impurity region below the gate region in the top Si layer, wherein the impurity region below the gate region has a higher impurity level than regions below the open areas in the top Si layer to allow a selective removal of the impurity region below the gate region relative to the regions below the open areas in the top Si layer; and
    removing the impurity region in the top Si layer below the gate region by selective etching using the regions below the open areas in the top Si layer as a stopping layer, thereby creating a gap between the regions below the open areas in the top Si layer.

2. The method of forming a transistor structure according to claim 1, further comprising:
    forming a silicon dioxide capping layer;
    wafer bonding the substrate to a second substrate, wherein the second substrate comprises a silicon dioxide top layer, and wherein the capping layer is face-to-face with the silicon dioxide top layer.

3. The method of forming a transistor structure according to claim 1, further comprising:
    initially removing the supporting Si layer using the buried insulating layer as a stopping layer;
    further removing the buried insulating layer using the top Si layer as a stopping layer.

4. The method of forming a transistor structure according to claim 1, further comprising using one of the dielectric region and the gate region as an additional stopping layer for removing the impurity region of the top Si layer below the gate region.

5. The method of forming a transistor structure according to claim 1, further comprising depositing a channel layer in the gap to form a channel region.

6. The method of forming a transistor structure according to claim 1, wherein the ion beam comprises ions of one of Ge, I, and Br.

7. The method of forming a transistor structure according claim 1, wherein the transistor structure is a MOSFET structure.

8. A transistor structure on a substrate, comprising a gate region, and a source and drain region, wherein the transistor structure is fabricated according to the method of claim 1.

9. The method of claim 1, wherein the ion implantation is performed at an angle substantially perpendicular to the top Si layer.

10. The method of claim 1, wherein the impurity region below the gate region in the top Si layer extends over substantially the whole area in the top Si layer below the gate region.

11. The method of claim 1, wherein the impurity regions below the open areas in the buried insulating layer and the impurity region below the gate region in the top Si layer are formed in the same ion implantation process.

12. The method of forming a transistor structure according to claim 5, wherein the channel layer comprises as channel material at least one of the following: a semiconductor material including one of Si, SiGe, Ge, GaAs, and InP, a III-V compound, a II-VI compound, a metal, an intermetallic compound, an organic compound, and a bio-organic compound.

13. The method of forming a transistor structure according to claim 5, wherein the channel layer comprises one of a quantum wire structure and a quantum dot structure.

14. The method of forming a transistor structure according to claim 13, wherein the channel layer comprises one of nano-wires, an array of nano-dots, carbon nano-dots, and nano-tubes.

15. A semiconductor device comprising a transistor structure in accordance with claim 8.

16. A method of forming a transistor structure on a substrate comprising a supporting Si layer, a buried insulating layer, and a top Si layer, the method comprising:

forming an emitter region of the transistor structure on the top Si layer, wherein the emitter region is separated from the top Si layer by a base layer, and wherein the top Si layer is doped;

forming open areas on the top Si layer demarcated by at least one of a demarcating oxide, a resist layer region, and the emitter region;

exposing the transistor structure comprising the open areas to ion implantation through the emitter region wherein the demarcating layer region and the emitter region act as an implantation mask so as to simultaneously form impurity regions below the open areas in the buried insulating layer and an impurity region below the emitter region in the top Si layer, wherein the impurity region below the emitter region has a higher impurity level than regions below the open areas in the top Si layer to allow a selective removal of the impurity region below the emitter region relative to the regions below the open areas in the top Si layer; and removing the impurity region in the top Si layer below the emitter region by selective etching using the regions below the open areas in the top Si layer as stopping layer, thereby creating a gap between the regions below the open areas in the top Si layer.

17. The method of claim 16, further comprising:
forming a silicon dioxide capping layer;
wafer bonding the substrate to a second substrate, wherein the second substrate comprises a silicon dioxide top layer, and wherein the capping layer is face-to-face with the silicon dioxide top layer.

18. The method of claim 16, further comprising:
initially removing the supporting Si layer using the buried insulating layer as a stopping layer;
further removing the buried insulating layer using the top Si layer as a stopping layer.

19. The method of claim 16, further comprising:
depositing a collector layer in the gap to form a collector region.

20. The method of claim 16, wherein the ion implantation is performed at an angle substantially perpendicular to the top Si layer.

21. The method of claim 16, wherein the impurity regions below the open areas in the buried insulating layer and the impurity region below the emitter region in the top Si layer are formed in the same ion implantation process.

22. The method of claim 16, wherein the impurity region below the emitter region in the top Si layer extends over substantially the whole area in the top Si layer below the emitter region.

* * * * *